(12) United States Patent
Hwang

(10) Patent No.: US 10,269,877 B2
(45) Date of Patent: Apr. 23, 2019

(54) DISPLAY DEVICE

(71) Applicant: Samsung Display Co., Ltd., Yongin-si, Gyeonggi-do (KR)

(72) Inventor: Won Mi Hwang, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/869,784

(22) Filed: Sep. 29, 2015

(65) Prior Publication Data

US 2016/0284771 A1 Sep. 29, 2016

(30) Foreign Application Priority Data

Mar. 24, 2015 (KR) .................. 10-2015-0040650

(51) Int. Cl.
| | | |
|---|---|---|
| *H01L 23/58* | (2006.01) | |
| *H01L 27/32* | (2006.01) | |
| *G09G 3/00* | (2006.01) | |
| *H01L 51/00* | (2006.01) | |
| *G09G 3/3233* | (2016.01) | |

(52) U.S. Cl.
CPC ........ *H01L 27/3223* (2013.01); *G09G 3/006* (2013.01); *H01L 27/3258* (2013.01); *H01L 27/3262* (2013.01); *H01L 51/0031* (2013.01); *G09G 3/3233* (2013.01); *G09G 2300/043* (2013.01); *G09G 2300/0861* (2013.01); *G09G 2330/12* (2013.01)

(58) Field of Classification Search
None
See application file for complete search history.

(56) References Cited

U.S. PATENT DOCUMENTS

| | | | |
|---|---|---|---|
| 8,294,158 B2 | 10/2012 | Park et al. | |
| 2005/0156845 A1* | 7/2005 | Lee | G09G 3/3648 345/92 |
| 2013/0092937 A1* | 4/2013 | Lee | G09G 3/006 257/48 |
| 2014/0027720 A1* | 1/2014 | Kim | H01L 27/3225 257/40 |

FOREIGN PATENT DOCUMENTS

| | | | |
|---|---|---|---|
| JP | 7-56192 A | | 3/1995 |
| JP | 2011-059374 | * | 3/2011 |
| KR | 10-1999-0011355 A | | 2/1999 |
| KR | 10-2003-0048627 A | | 6/2008 |
| KR | 10-2014-0094723 A | | 7/2014 |

\* cited by examiner

*Primary Examiner* — Nishath Yasmeen
(74) *Attorney, Agent, or Firm* — Lewis Roca Rothgerber Christie LLP

(57) ABSTRACT

A display device is disclosed. In one aspect, a plurality of pixels are formed in a display area, and the pixels include a first pixel including a thin film transistor (TFT). The display device includes a test unit formed in a peripheral area surrounding the display area, and the test unit includes a test transistor configured to measure a characteristic of the TFT included in the first pixel. The display device also includes a first insulating layer formed over the test transistor and the display area, and a plurality of dummy contact holes are formed in the first insulating layer and the test unit.

18 Claims, 12 Drawing Sheets

# DISPLAY DEVICE

CROSS-REFERENCE TO RELATED APPLICATION

This application claims priority to and the benefit of Korean Patent Application No. 10-2015-0040650 filed in the Korean Intellectual Property Office on Mar. 24, 2015, the entire contents of which are incorporated herein by reference.

BACKGROUND

Field

The described technology generally relates to a display device.

Description of the Related Technology

A flat display device such as a liquid crystal display or an organic light-emitting diode (OLED) display includes a display panel including a matrix of pixels having switching elements and display signal lines. The display also includes a gate driver that supplies gate signals to gate lines so as to turn the switching elements on and off, a data driver for applying the data voltage to a data line, and a signal controller for controlling the above elements.

The gate driver and the data driver can be mounted on the display device as an IC chip type, a flexible printed circuit film as a tape carrier package (TCP) type and attached to the display device, or a printed circuit board (PCB).

An OLED display has favorable characteristics in terms of power consumption, response speed, viewing angle, and contrast ratio since it does not require an additional light source. Further, OLED technology allows reduction in thickness and superiority in luminance and color purity (wide color gamut), thereby having applications as a flexible display.

Each OLED includes a pixel electrode, an opposed electrode, and a light emission layer interposed therebetween. One of the pixel electrode and the opposed electrode serves as an anode, and the other serves as a cathode. Electrons injected from the cathode and holes injected from the anode are combined in the light emission layer to generate excitons, and the excitons release energy to emit light. The opposed electrode is formed across the pixels to receive a predetermined common voltage.

The pixels included in such a display device are positioned in a display area where an image is displayed, and a switching element included in a pixel constituting a pixel driving circuit can include at least one thin film transistor (TFT). For example, a pixel driving circuit of an OLED display includes at least one TFT connected to an OLED.

Characteristics of TFTs included in the pixels positioned in the display area can experience variances due to manufacturing process factors. For example, although no abnormal operation may occur during while at room temperature, problems can result from extreme conditions such as a relatively high or low temperature. When there is a problem with the TFTs, it can affect the quality of the displayed image. Accordingly, it is necessary to inspect the TFT characteristics (e.g., a threshold voltage) included in the pixels of the display device.

However, when directly measuring the characteristics of the TFTs positioned in the display area, the thin film transistor can be damaged. For that reason, a test unit is formed at a portion (e.g., a peripheral portion) of a display panel. The test unit can include a TFT having a characteristic that is similar to those of the TFTs positioned in the display area. This test unit is also referred to as a test element group (TEG) pattern. It is possible to measure the current of the TFT of the test unit by applying a voltage through a pad unit connected to the test unit in order to determine the quality of the TFT of the pixel formed in the same process as the process during which the TFT of the test unit is formed.

However, a peripheral pattern condition of the TFT of the pixel positioned in the display area is different from that of the test unit, and as a result, a value measured in the test unit may not reflect an actual characteristic of the TFT of the display area. Accordingly, there is a large difference between the characteristics of the test unit and the display area.

The above information disclosed in this Background section is only for enhancement of understanding of the background of the invention and therefore it can contain information that does not form the prior art that is already known in this country to a person of ordinary skill in the art.

SUMMARY OF CERTAIN INVENTIVE ASPECTS

One inventive aspect relates to a display device that includes a test unit having a characteristic that is substantially the same as that of a TFT included in a pixel.

The above display device can include: a plurality of pixels formed in a display area; and a test unit formed at a peripheral area positioned around the display area, wherein the test unit includes a test transistor for inspecting a characteristic of a TFT included in the pixel, and the display device further includes a first insulating layer formed in the display area and the peripheral area and positioned on the test transistor, wherein the first insulating layer includes a plurality of dummy contact holes formed around the test transistor.

The dummy contact holes can be formed in a plurality of dummy pixel areas positioned around a test pixel area in which the test transistor is formed, and at least one of the dummy pixel areas can be positioned on any side of the test pixel area.

The dummy pixel area can have a size that is substantially the same as that of the pixel positioned in the display area.

The display device can further include: a substrate positioned below the first insulating layer; and at least one second insulating layer formed between the first insulating layer and the substrate, and the dummy contact hole can expose either one of the substrate and the at least one second insulating layer.

The first insulating layer can have first contact holes positioned in the pixel, and a number and/or disposition of the dummy contact holes positioned in one of the dummy pixel areas can be the same as those of the first contact holes positioned in the pixel.

The first insulating layer can have second contact holes positioned in the test pixel area, and a number and/or disposition of the second contact holes positioned in the test pixel area can be the same as those of the first contact holes positioned in the pixel.

The second contact holes can include a contact hole overlapping the test transistor and a contact hole that does not overlap the test transistor.

The dummy pixel area can have the same structure as the pixel positioned in the display area.

The test pixel area can be surrounded by the dummy pixel areas, and the test pixel area can have the same structure as the pixel positioned in the display area.

The first insulating layer can have first contact holes positioned in the pixel, and a number and/or disposition of the dummy contact holes positioned in one of the dummy pixel areas can be the same as those of the first contact holes positioned in the pixel.

The dummy pixel area can have a TFT having the same structure as the TFT included in the pixel.

The first insulating layer can has second contact holes positioned in the test pixel area, and a number and/or disposition of the second contact holes positioned in the test pixel area can be the same as those of the first contact holes positioned in the pixel.

The test transistor can have the same structure as the TFT included in the pixel.

Another aspect is a display device, comprising: a plurality of pixels formed in a display area, wherein the pixels include a first pixel including a thin film transistor (TFT); a test unit formed in a peripheral area surrounding the display area, wherein the test unit includes a test transistor configured to measure a characteristic of the TFT included in the first pixel; and a first insulating layer formed over the test transistor and the display area, wherein a plurality of dummy contact holes are formed in the first insulating layer and the test unit.

In the above display device, the dummy contact holes are formed in a plurality of dummy pixel areas positioned around a test pixel area in which the test transistor is formed, wherein at least one of the dummy pixel areas is positioned on at least one side of the test pixel area.

In the above display device, the dummy pixel areas have a size that is substantially the same as that of the first pixel positioned in the display area.

The above display device further comprises: a substrate positioned below the first insulating layer; and at least one second insulating layer formed between the first insulating layer and the substrate, wherein at least one of the dummy contact holes exposes at least one of the substrate and the at least one second insulating layer.

In the above display device, a plurality of first contact holes are formed in a first portion of the first insulating layer located in the first pixel, wherein at least one of the number and position of the dummy contact holes positioned in one of the dummy pixel areas is the same as that of the first contact holes positioned in the first pixel.

In the above display device, the first insulating layer has a plurality of second contact holes formed in a second portion of the first insulating layer located in the test pixel area, wherein at least one of the number and position of the second contact holes are the same as that of the first contact holes.

In the above display device, the second contact holes include a contact hole overlapping the test transistor and a contact hole that does not overlap the test transistor, in the depth dimension of the display device.

In the above display device, at least one of the dummy pixel areas has the same structure as the first pixel positioned in the display area.

In the above display device, the test pixel area is surrounded by the dummy pixel areas, wherein the test pixel area has the same structure as the first pixel positioned in the display area.

In the above display device, a plurality of first contact holes are formed in a first portion of the first insulating layer located in the first pixel, wherein at least one of the number and position of the dummy contact holes is the same as that of the first contact holes.

In the above display device, the dummy pixel area has a TFT having the same structure as the TFT included in the first pixel.

In the above display device, the first insulating layer has a plurality of second contact holes formed in a second portion of the first insulating layer located in the test pixel area, wherein at least one of the number and position of the second contact holes is the same as that of the first contact holes.

In the above display device, the test transistor has the same structure as the TFT included in the first pixel.

Another aspect is a display device, comprising: a plurality of pixels formed in a display area, wherein the pixels include a first pixel including a thin film transistor (TFT) and a first contact hole; a test unit formed in a peripheral area surrounding the display area, wherein the peripheral area includes a test pixel area and a plurality of dummy pixel areas surrounding the test pixel area, and wherein the test unit includes a test transistor formed in the test pixel area and a plurality of dummy contact holes formed in each of the test pixel area and the dummy pixel areas; and a first insulating layer formed over the test transistor in the display area and the peripheral area, wherein the TFT in the first pixel and the test transistor in the test unit have substantially the same structure.

In the above display device, the dummy pixel areas have a size that is substantially the same as that of the first pixel positioned in the display area.

In the above display device, each of the dummy contact holes exposes either one of the substrate or at least one second insulating layer.

The above display device further comprises at least one conductive line formed in the first contact hole and formed over the first insulating layer, wherein the dummy contact holes do not have a conductive line formed therein.

In the above display device, the first contact hole includes a plurality of first contact holes formed in the first pixel, wherein the number of the first contact holes and the number of the dummy contact holes in one of the dummy pixel areas are the same.

In the above display device, the first contact hole includes a plurality of first contact holes formed in the first pixel, wherein the relative positions of the first contact holes in the first pixel and the dummy contact holes in one of the dummy pixel areas are substantially the same.

In the above display device, the test unit is formed adjacent to a lower right corner of the display area.

According to at least one of the disclosed embodiments, it is possible to accurately determine characteristics of the TFTs included in the pixels and facilitate management of the characteristic of the display device.

DETAILED DESCRIPTION OF CERTAIN INVENTIVE EMBODIMENTS

Figure 1:
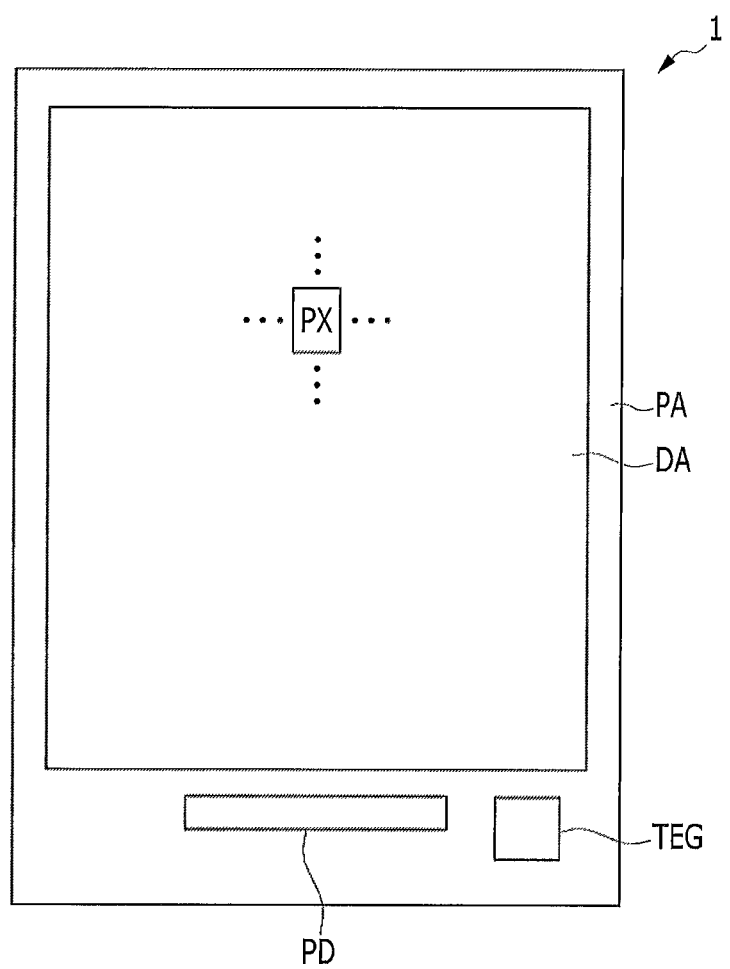
FIG. 1 is a layout view of a display device according to an exemplary embodiment.

The described technology will be described more fully hereinafter with reference to the accompanying drawings, in which exemplary embodiments of the described technology are shown. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present.

To clearly describe the described technology, parts that are irrelevant to the description are omitted, and like numerals refer to like or similar constituent elements throughout the specification.

Throughout this specification and the claims that follow, when it is described that an element is "coupled" to another element, the element can be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements. In this disclosure, the term "substantially" includes the meanings of completely, almost completely or to any significant degree under some applications and in accordance with those skilled in the art. The term "connected" can include an electrical connection.

Hereinafter, a display device according to an exemplary embodiment will be described with FIG. 1 to FIG. 4.

Figure 2:
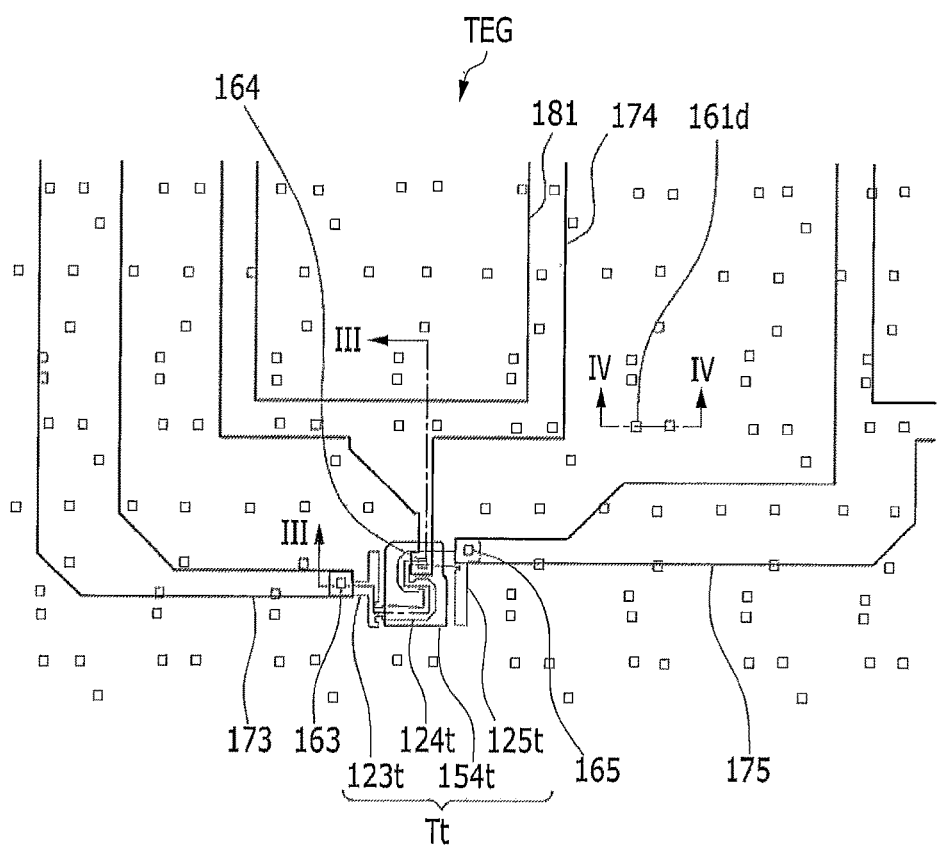
FIG. 2 is an enlarged top plan view illustrating a portion of a display device according to an exemplary embodiment.
Figure 3:
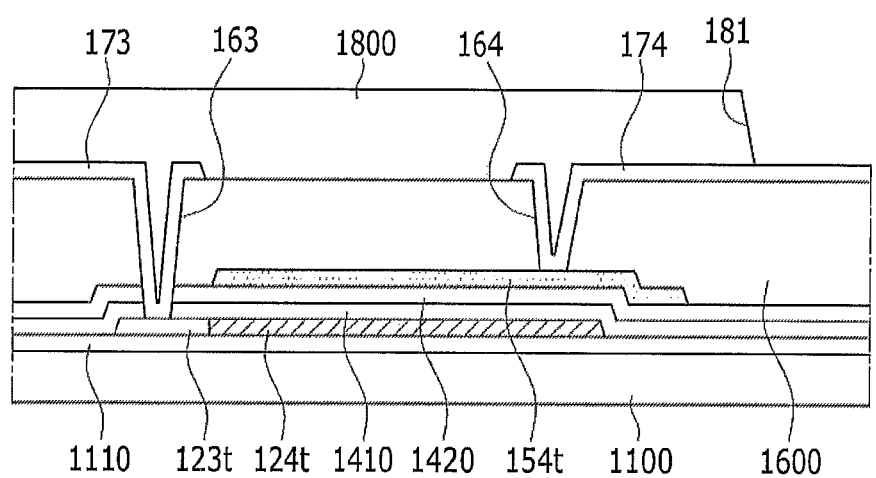
FIG. 3 is a cross-sectional view illustrating the display device of FIG. 2 taken along a line thereof.
Figure 4:
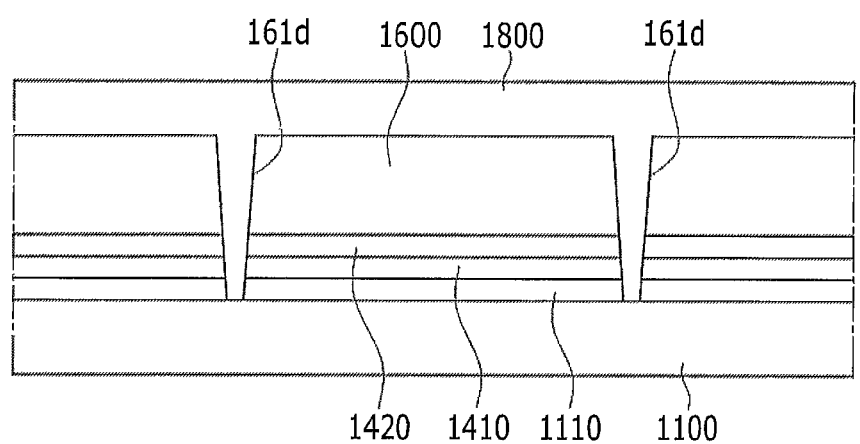
FIG. 4 is a cross-sectional view illustrating the display device of FIG. 2 taken along a line IV-IV thereof.

FIG. 1 is a layout view of a display device according to an exemplary embodiment. FIG. 2 is an enlarged top plan view illustrating a portion of a display device according to an exemplary embodiment. FIG. 3 is a cross-sectional view illustrating the display device of FIG. 2 taken along a line III-III thereof. FIG. 4 is a cross-sectional view illustrating the display device of FIG. 2 taken along a line IV-IV thereof.

Referring to FIG. 1, the display device according to the exemplary embodiment includes a display panel 1.

When viewed from a planar structure, the display panel 1 includes a display area DA for displaying an image and a peripheral area PA positioned around the display area DA.

A plurality of pixels PX and a plurality of display signal lines (not illustrated) which are connected thereto to transfer driving signals are positioned in the display area DA.

The display signal lines include a plurality of gate signal lines (not illustrated) for transferring gate signals and a plurality of data lines (not illustrated) for transferring data signals. The gate lines and the data lines can cross each other. The display signal lines can be connected to a pad unit PD and formed along the peripheral area PA. The pad unit PD can be formed at a side in the peripheral area PA of the display panel 1.

The pixels PX can be arranged substantially in a matrix form, but the present exemplary embodiment is not limited thereto. Each of the pixels PX can include at least one switching element (not illustrated) connected to a gate line and a date line, and a pixel electrode (not illustrated) connected thereto. The switching element can be a three-terminal element such as a TFT that is integrated in the display panel 1. At least one switching element included in each pixel PX can be turned on or off according to a gate signal transferred through the gate line to selectively transfer a data signal transferred through the data line to the pixel electrode.

In order to implement color display, each pixel PX can display a primary color, and a desired color can be recognized by combining the primary colors. An example of the primary colors can include three primary colors or four primary colors such as red, green, blue, and the like.

A test unit TEG is formed in the peripheral area PA. For example, the test unit TEG is formed at a corner of the peripheral area PA close to the pad unit PD or beside the pad unit PD, but the present exemplary embodiment is not limited thereto.

Referring to FIG. 2 to FIG. 4, the test unit TEG includes at least one test transistor Tt.

Hereinafter, a cross-sectional structure of the display panel 1, particularly a cross-sectional structure of the test unit TEG, will be described with reference to FIG. 2 to FIG. 4.

A buffer layer 1110 can be formed on a substrate 1100 formed of an insulating material such as glass, quartz, ceramic, or plastic. The buffer layer 1110 can be omitted.

At least one test transistor Tt can be formed on the substrate 1100 or the buffer layer 1110. FIG. 2 illustrates an example in which one test unit TEG includes one test transistor Tt, but the embodiments are not limited thereto.

The test transistor Tt includes a channel region 124t, a source region 123t, a drain region 125t, and a gate electrode 154t.

The channel region 124t, the source region 123t, and the drain region 125t can be formed on one layer, and the source region 123t and the drain region 125t can be formed on opposite sides of the channel region 124t. The source region 123t and the drain region 125t can be connected to the channel region 124t. The source region 123t and the drain region 125t have a conductive property. Accordingly, the source region 123t and the drain region 125t can respectively serve as a source electrode and a drain electrode of the test transistor Tt.

The channel region 124t, the source region 123t, and the drain region 125t can be formed of a semiconductor material such as polysilicon or an oxide semiconductor. When the channel region 124t, the source region 123t, and the drain region 125t are formed of the oxide semiconductor, the buffer layer 1110 can be required between the substrate 1100 and the layer at which the channel region 124t, the source region 123t, and the drain region 125t are positioned.

The channel region 124t can be channel-doped with n-type impurities or p-type impurities.

At least one gate insulating layer is formed on the channel region 124t, the source region 123t, and the drain region 125*t*. For example, the gate insulating layer includes a first gate insulating layer 1410 and a second gate insulating layer 1420.

The first gate insulating layer 1410 and the second gate insulating layer 1420 can be formed of an inorganic insulating material.

A gate electrode 154*t* is formed on the second gate insulating layer 1420. The gate electrode 154*t* overlaps the channel region 124*t* of the test transistor Tt.

An interlayer insulating layer (or first insulating layer) 1600 is formed on the gate electrode 154*t*. The interlayer insulating layer 1600 can be formed of a ceramic-based material such as a silicon nitride ($SiN_x$) or a silicon oxide ($SiO_x$).

The interlayer insulating layer 1600 formed in the test unit TEG, and the interlayer insulating layer 1600, the first gate insulating layer 1410, and the second gate insulating layer 1420 have a plurality of contact holes formed to overlap the test transistor Tt and a plurality of dummy contact holes 161*d* formed to not overlap the test transistor Tt. The first and second gate insulating layers 1410 and 1420 are also called second insulating layers.

First, the contact holes overlapping the test transistor Tt will be described. The interlayer insulating layer 1600 has a contact hole 164 that is formed to expose the gate electrode 154*t*. The interlayer insulating layer 1600, the first gate insulating layer 1410, and the second gate insulating layer 1420 have contact holes that are respectively formed to expose the source region 123*t* and the drain region 125*t* of the test transistor Tt.

The dummy contact holes 161*d* that do not overlap the test transistor Tt include dummy contact holes 161*d* formed around the test transistor Tt. As shown in FIG. 2, the dummy contact holes 161*d* can be generally distributed in the test unit TEG to be separated from each other, or can be distributed at a region around the test transistor Tt.

An area of the region of the test unit TEG at which the dummy contact holes 161*d* are distributed can be the same as an area obtained by summing areas of about 9 pixels PX to about 40 pixels PX positioned in the display area DA, but the present exemplary embodiment is not limited thereto.

The dummy contact holes 161*d* can expose any one of the first gate insulating layer 1410, the second gate insulating layer 1420, the buffer layer 1110, and the substrate 1100. As shown in FIG. 4, the dummy contact holes 161*d* can be formed to extend to at least a portion of the buffer layer 1110, and can be exclusively formed in the interlayer insulating layer 1600, the first gate insulating layer 1410, and the second gate insulating layer 1420.

A data conductive layer is formed on the interlayer insulating layer 1600. The data conductive layer includes a source-connecting electrode 173 connected to a source region 123*t* through a contact hole 163, a drain-connecting electrode 175 connected to a drain region 125*t* of the test transistor Tt through a contact hole 165, and a gate-connecting electrode 174 connected to a gate electrode 154*t* of the test transistor Tt through a contact hole 164. The source-connecting electrode 173, the drain-connecting electrode 175, and the gate-connecting electrode 174 can be included in a pad unit by expanding their end portions.

To inspect characteristics such as a source-drain current of the test transistor Tt and a threshold voltage, a test result signal is obtained through the pad unit of the drain-connecting electrode 175 to be analyzed after a gate signal is applied to the pad unit of the gate-connecting electrode 174 connected to the test transistor Tt. Then, a test signal is applied to the pad unit of the source-connecting electrode 173.

A passivation layer 1800 formed of an organic insulating material or an inorganic insulating material is formed on the data conductive layer. The passivation layer 1800 can include a via hole 181 exposing the pad unit.

The structure of the test transistor Tt can be differently modified without being limited to the above description and illustration.

Although will be described in detail, each pixel PX positioned in the display area DA of the display panel 1 includes at least one TFT that can be formed by using the same process as that of the test transistor Tt. The interlayer insulating layer 1600 formed in the pixels PX has a contact hole overlapping the TFT. Also, the interlayer insulating layer 1600, the first gate insulating layer 1410, and the second gate insulating layer 1420 have a contact hole overlapping the TFT. Since the pixels PX are arranged in the display area DA, a plurality of contact holes are formed around a TFT of one pixel PX to correspond to another pixel PX.

According to the present exemplary embodiment, the contact holes 163, 164, and 165 and the dummy contact holes 161*d* (included in the interlayer insulating layer 1600 formed in the test unit TEG and/or the first gate insulating layer 1410 and the second gate insulating layer 1420) can be formed through a photolithography step along with the contact holes positioned in the display area DA in a manufacturing process of the display panel 1. Thereafter, a heating step such as annealing can be performed. This contact hole forming step and the following step can cause the characteristics of the TFTs included in the test transistor Tt and pixels PX to be changed through the contact holes overlapping the TFTs and the contact holes positioned around the TFTs. Accordingly, the characteristic of one TFT can be significantly affected according to existence and distribution of the contact holes positioned therearound.

As in the present exemplary embodiment, when the dummy contact hole 161*d* is formed around the test transistor Tt, a surrounding condition that is substantially similar or identical to the case in which a plurality of contact holes corresponding to other pixels (formed around the TFTs included in a pixel PX of the display area DA) is provided to the test transistor Tt. Accordingly, in the contact forming process, a change in the characteristic of the TFT included in the pixel PX is substantially the same as that of the characteristic of the test transistor Tt formed in the test unit TEG, and a measured characteristic of the test transistor Tt is substantially the same as the characteristic of the TFT included in the pixel PX. As a result, although the characteristic of the TFT formed in the pixel PX is not directly inspected, it is possible to correctly determine a state of the TFT formed in the pixel PX by inspecting the characteristic of the test transistor Tt of the test unit TEG.

Figure 5:
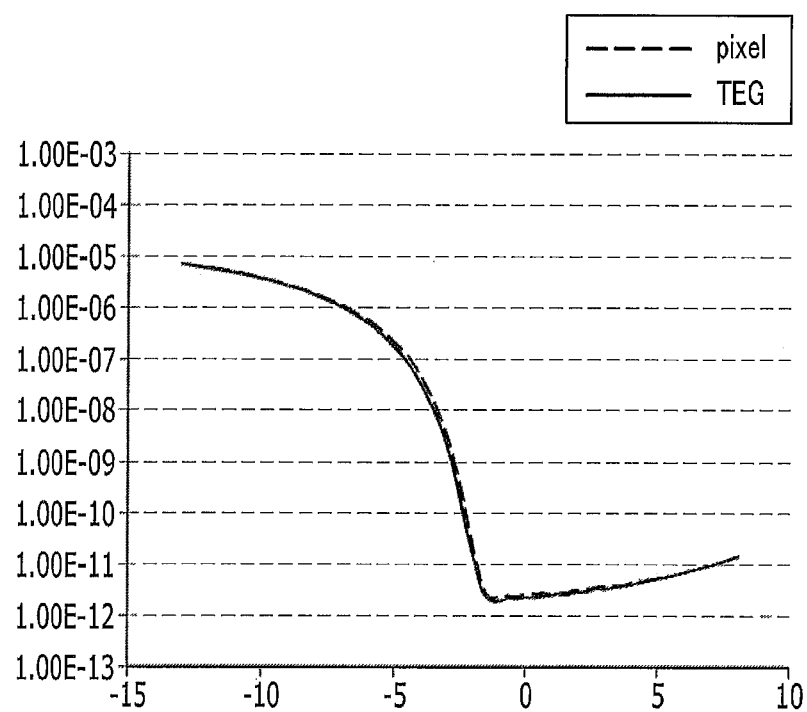
FIG. 5 is a graph illustrating characteristics of a TFT included in a pixel of a display device according to an exemplary embodiment and a test transistor included in a test unit.

FIG. 5 is a graph illustrating characteristics of a TFT included in a pixel of a display device according to an exemplary embodiment and a test transistor included in a test unit. In the graph of FIG. 5, the horizontal axis indicates a gate voltage, while the vertical axis indicates a source-drain current.

Referring to FIG. 5, as described above, the current characteristic and threshold voltage of the TFT included in the pixel PX of the display panel 1 is substantially the same as those of the test transistor Tt included in the test unit TEG.

Hereinafter, an example of the pixel PX of the display panel 1 according to an exemplary embodiment will be described with reference to FIG. 6 to FIG. 10. In the present exemplary embodiment, the OLED display is taken as an example.

Figure 6:
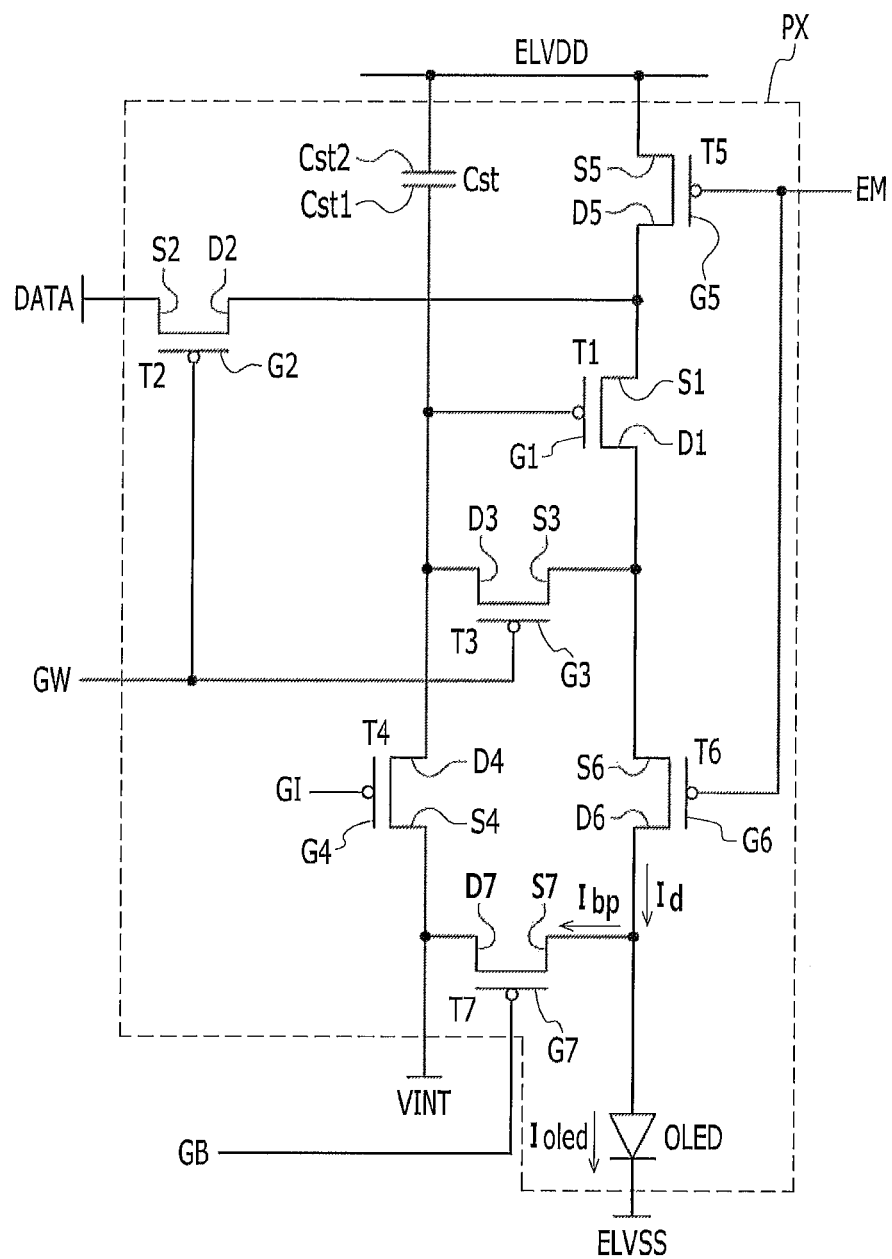
FIG. 6 is an equivalent circuit diagram of one pixel of a display device according to an exemplary embodiment.
Figure 7:
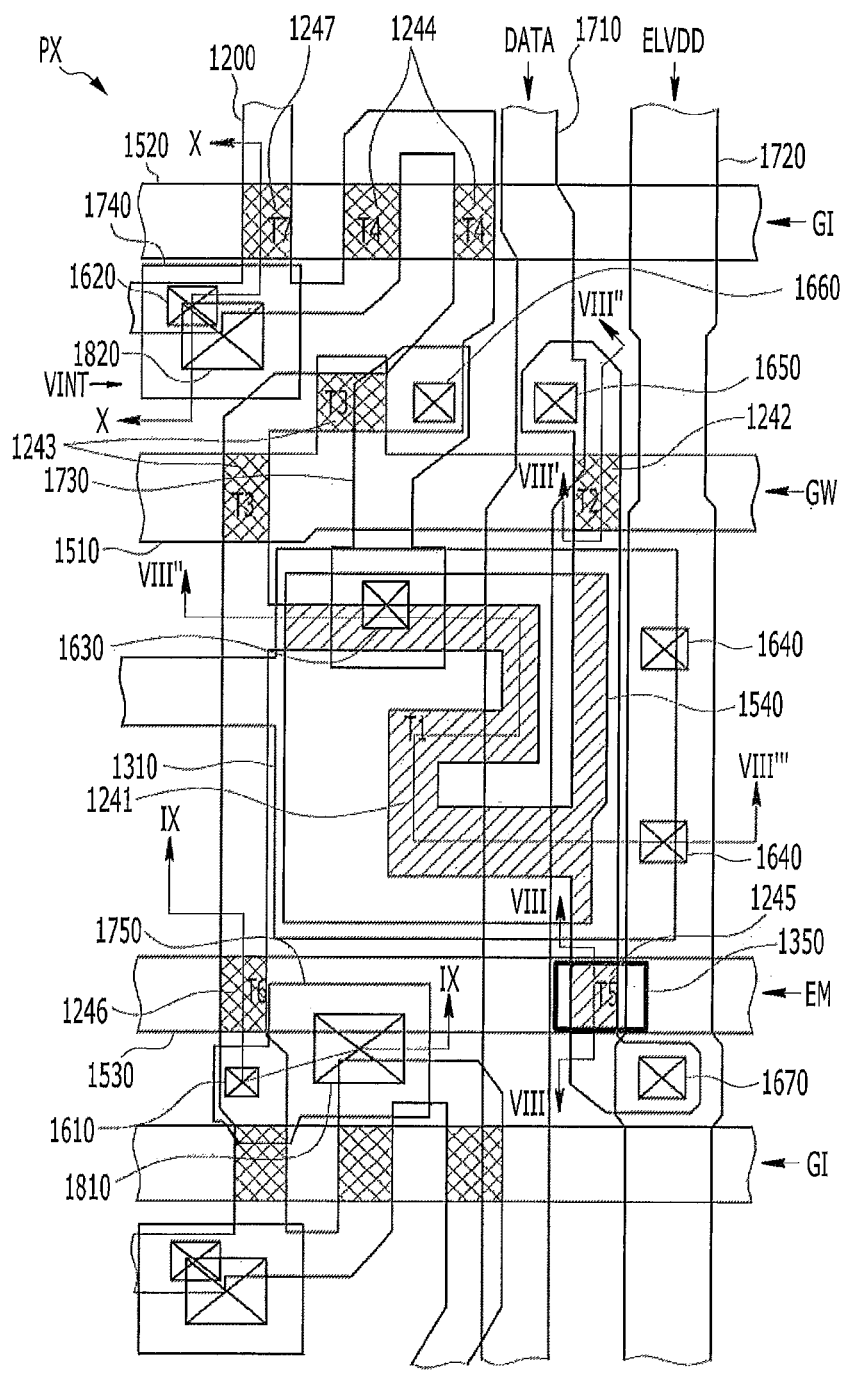
FIG. 7 is a layout view of one pixel of a display device according to an exemplary embodiment.
Figure 8:
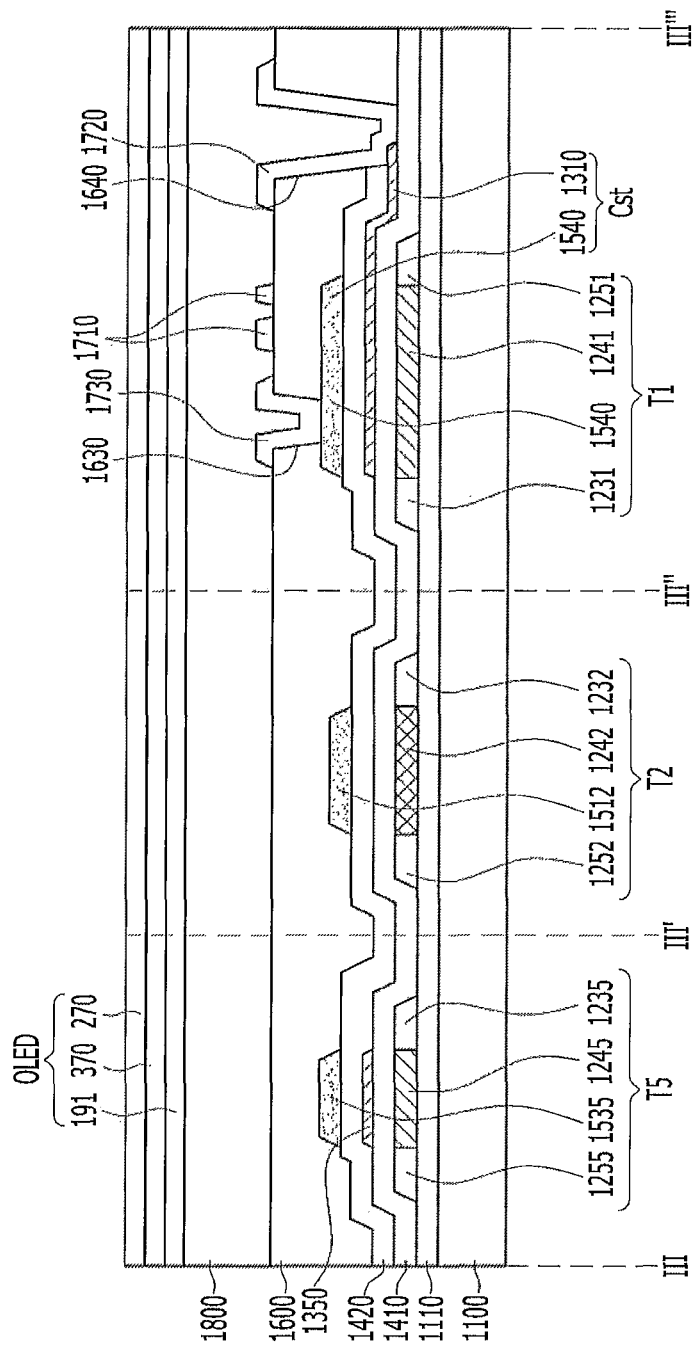
FIG. 8 is a cross-sectional view illustrating the display device of FIG. 7 taken along a line VIII-VIII'-VIII"-VIII"'.
Figure 9:
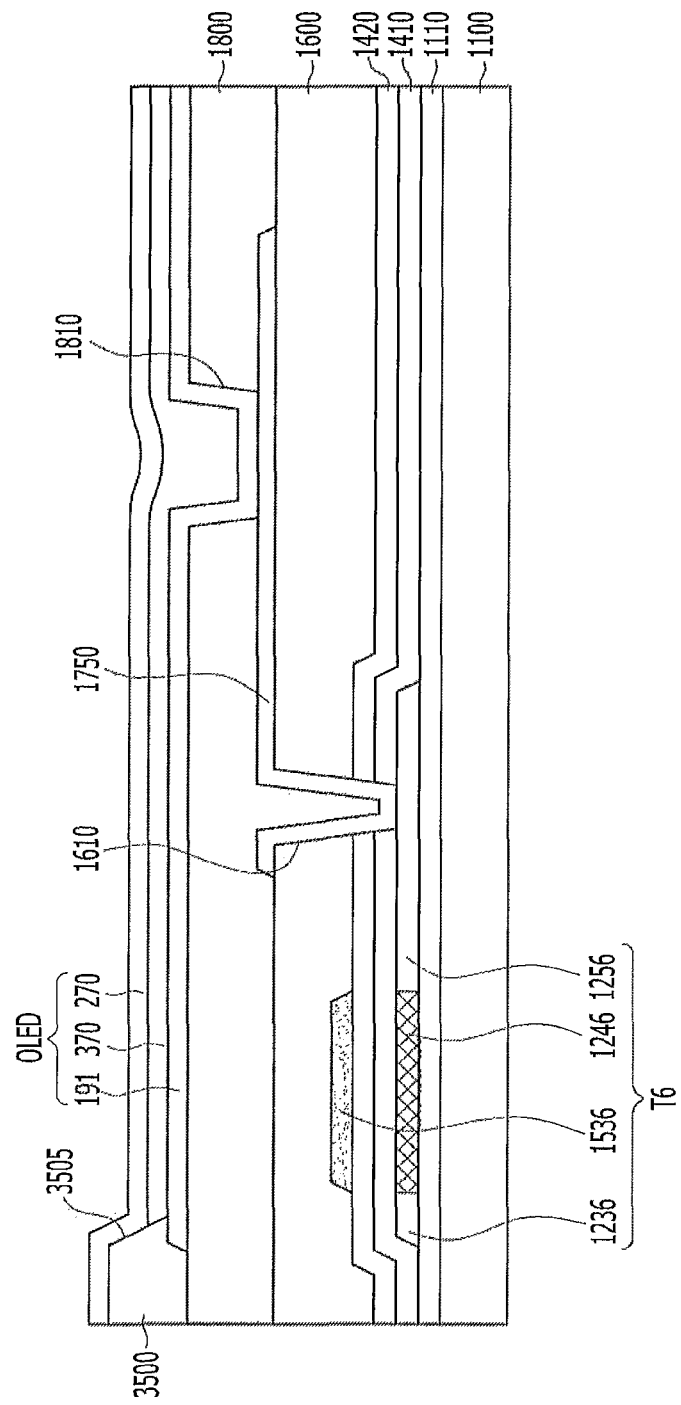
FIG. 9 is a cross-sectional view illustrating the display device of FIG. 7 taken along a line IV-IV.
Figure 10:
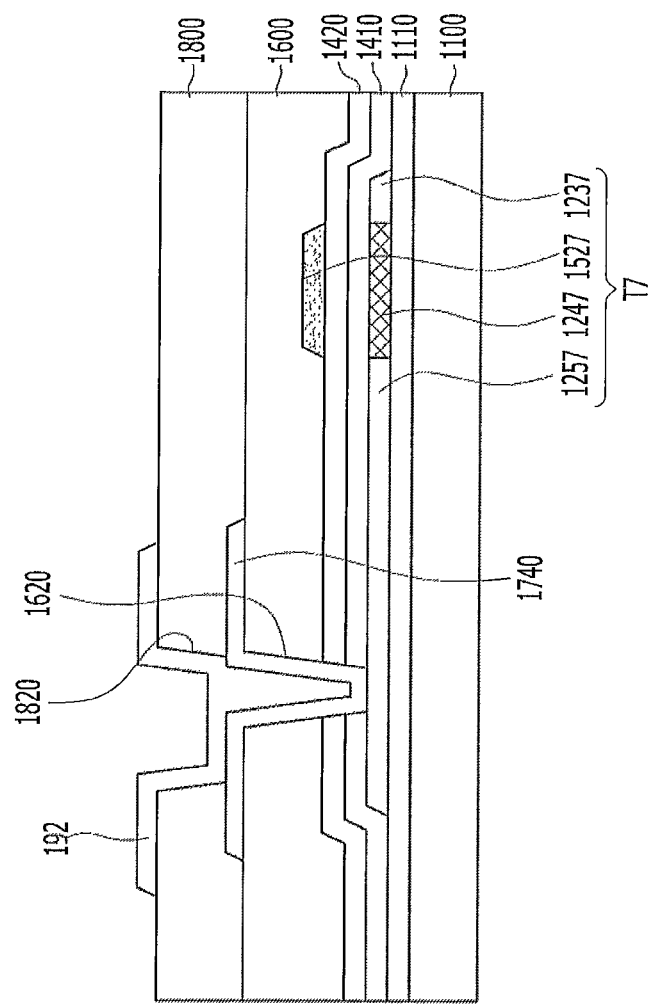
FIG. 10 is a cross-sectional view illustrating the display device of FIG. 7 taken along a line X-X.

FIG. 6 is an equivalent circuit diagram of one pixel of a display device according to an exemplary embodiment. FIG. 7 is a layout view of one pixel of a display device according to an exemplary embodiment. FIG. 8 is a cross-sectional view illustrating the display device of FIG. 7 taken along a line VIII-VIII'-VIII"-VIII'". FIG. 9 is a cross-sectional view illustrating the display device of FIG. 7 taken along a line IV-IV. FIG. 10 is a cross-sectional view illustrating the display device of FIG. 7 taken along a line X-X.

First, referring to FIG. 6, one pixel PX of the display device according to the exemplary embodiment includes a plurality of transistors T1, T2, T3, T4, T5, T6, and T7, a storage capacitor Cst, and an OLED.

The transistors can include a driving TFT T1, a switching TFT T2, a compensation transistor T3, an initialization transistor T4, an operation control transistor T5, a light emission control transistor T6, and a bypass transistor T7.

A gate electrode G1 of the driving transistor T1 is connected to one end Cst1 of the storage capacitor Cst, a source electrode S1 of the driving transistor T1 is connected to a driving voltage line (not shown) for transmitting a driving voltage ELVDD via the operation control transistor T5, and a drain electrode D1 of the driving transistor T1 is electrically connected to an anode of the OLED via the light emission control transistor T6. The driving transistor T1 receives a data signal DATA according to a switching operation of the switching transistor T2 to supply a light emission current Ioled to the OLED.

A gate electrode G2 of the switching transistor T2 is connected to a gate line (not shown) for transmitting a gate signal GW, a source electrode S2 of the switching transistor T2 is coupled to a data line (not shown) for transmitting the data signal DATA, and a drain electrode D2 of the switching transistor T2 is connected to the driving voltage line for transmitting the driving voltage ELVDD via the operation control transistor T5 while being connected to the source electrode S1 of the driving transistor T1. The switching transistor T2 can be turned on according to the gate signal GW, and can perform the switching operation for transmitting the data signal DATA transmitted from the data line to the source electrode of the driving transistor T1.

A gate electrode G3 of the compensation transistor T3 is directly connected to the gate line for transmitting the gate signal GW, and a source electrode S3 of the compensation transistor T3 is connected to the anode of the OLED via the light emission control transistor T6 while being connected to the drain electrode D1. A drain electrode D3 of the compensation transistor T3 is connected to one end Cst1 of the storage capacitor Cst, a drain electrode D4 of the initialization transistor T4, and the gate electrode G1 of the driving transistor T1. The compensation transistor T3 is turned on according to the gate signal GW to connect the gate and drain electrodes G1 and D1 of the driving transistor T1 to each other, thereby diode-connecting the driving transistor T1.

A gate electrode G4 of the initialization transistor T4 is connected to a previous gate line (not shown) for transmitting a gate signal GI. A source electrode S4 of the initialization transistor T4 is connected to an initialization voltage line (not shown) for transmitting an initialization voltage VINT, and the drain electrode D4 of the initialization transistor T4 is connected to one end Cst1 of the storage capacitor Cst, the drain electrode D3 of the compensation transistor T3, and the gate electrode G1 of the driving transistor T1. The gate signal GI can transmit a gate-on voltage earlier than the gate signal GW. In some embodiments, gate-on voltage periods of the gate signal GW and the gate signal GI do not overlap with each other.

The initialization transistor T4 is turned on according to the gate signal GI to transmit the initialization voltage VINT to the gate electrode G1 of the driving transistor T1, thereby performing an initializing operation for initializing a voltage of the gate electrode G1 of the driving transistor T1.

A gate electrode G5 of the operation control transistor T5 is coupled to a light emission control line (not shown) for transmitting a light emission control signal EM, a source electrode S5 of the operation control transistor T5 is coupled to the driving voltage line for transmitting the driving voltage ELVDD, and a drain electrode D5 of the operation control transistor T5 is coupled to the source electrode S1 of the driving transistor T1 and the drain electrode D2 of the switching transistor T2.

A gate electrode G6 of the light emission control transistor T6 is coupled to the light emission control line for transmitting the light emission control signal EM, a source electrode S6 of the light emission control transistor T6 is coupled to the drain electrode D1 of the driving transistor T1 and the source electrode S3 of the compensation transistor T3, and a drain electrode D6 of the light emission control transistor T6 is electrically coupled to the anode of the OLED. The operation control transistor T5 and the light emission control transistor T6 are substantially simultaneously (or concurrently) turned on according to the light emission control signal EM to transmit the driving voltage ELVDD to the source electrode S1 of the driving transistor T1 and to connect the OLED to the driving transistor T1, thereby allowing the light emission current Ioled to flow through the OLED.

A gate electrode G7 of the bypass transistor T7 is coupled to a bypass control line (not shown) for transmitting a bypass signal GB, and a source electrode S7 of the bypass transistor T7 is connected to the drain electrode D6 of the light emission control transistor T6 and the anode of the OLED. A drain electrode D7 of the bypass transistor T7 is connected to the initialization voltage line for transmitting the initialization voltage VINT and the source electrode S4 of the initialization transistor T4.

The other end Cst2 of the storage capacitor Cst is connected to the driving voltage line, and a cathode of the OLED is connected to a common voltage ELVSS. Accordingly, the OLED receives the driving current Id from the driving transistor T1 and emits light to display an image.

An example of a detailed structure of one pixel PX will be described with reference to FIG. 7 to FIG. 10 together with FIG. 6.

A buffer layer 1110 can be formed on a substrate 1100, and a semiconductor pattern 1200 can be formed the buffer layer 1110. The semiconductor pattern 1200 can be formed at the same layer as that of the channel region 124t, the source region 123t, and the drain region 125t of the test transistor Tt.

The semiconductor pattern 1200 can be integrally connected and can be curved in various shapes.

The semiconductor pattern 1200 can have a conductive property in regions except for channel regions 1241, 1242, 1245, 1246, and 1247 that form channels of respective transistors T1, T2, T3, T4, T5, T6, and T7. In FIG. 7, regions where the transistors T1 to T7 are marked correspond to the channel regions 1241, 1242, 1245, 1246, and 1247 of the respective transistors T1 to T7. The channel regions 1241, 1242, 1245, 1246, and 1247 of the semiconductor pattern 1200 can be channel-doped with n-type impurities or p-type impurities.

Conductive regions of the semiconductor pattern 1200 are source regions or drain regions of the respective transistors T1 to T7, which can form source electrodes or drain electrodes of the transistors T1 to T7. Along the semiconductor pattern 1200, the source and drain electrodes of the respective transistors T1 to T7 are positioned at opposite sides of the channel regions 1241, 1242, 1245, 1246, and 1247 of the respective transistors T1 to T7.

A driving source electrode 1231 and a driving drain electrode 1251 are positioned to face each other at the opposite sides of the channel region 1241 of the driving transistor T1. A switching source electrode 1232 and a switching drain electrode are 1252 are positioned to face each other at the opposite sides of the channel region 1242 of the switching transistor T2. A compensation source electrode (not shown) and a compensation drain electrode (not shown) are positioned to face each other at the opposite sides of the channel region of the compensation transistor T3 (not shown). An initialization source electrode (not shown) and an initialization drain electrode (not shown) are positioned to face each other at the opposite sides of the channel region of the initialization transistor T4 (not shown). An operation control source electrode 1235 and an operation control drain electrode 1255 are positioned to face each other at the opposite sides of the channel region 1245 of the operation control transistor T5. A light emission control source electrode 1236 and a light emission control drain electrode 1256 are positioned to face each other at the opposite sides of the channel region 1246 of the light emission control transistor T6, and a bypass source electrode 1237 and a bypass drain electrode 1257 are positioned to face each other at the opposite sides of the channel region 1247 of the bypass transistor T7.

The conductive regions of the semiconductor pattern 1200 can be formed to be doped with the opposite or same type of doping impurities that are doped in the channel regions.

The semiconductor pattern 1200 can be formed of polysilicon or an oxide semiconductor.

A first gate insulating layer 1410 is formed on the semiconductor pattern 1200.

A first gate conductive layer is formed on the first gate insulating layer 1410. The first gate conductive layer can include gate patterns 1310 and 1350.

The channel region 1241 of the driving transistor T1 can include a region overlapping the gate pattern 1310 while interposing the first gate insulating layer 1410 therebetween, and the channel region 1245 of the operation control transistor T5 can include a region overlapping the gate pattern 1350 while interposing the first gate insulating layer 1410 therebetween. The gate pattern 1310 can be an island that is confined to each pixel PX, or the gate patterns 1310 of adjacent pixels PX can be connected to each other. The gate pattern 1350 can be an island that is confined to each pixel PX.

A second gate insulating layer 1420 is formed on the first gate conductive layer.

A second gate conductive layer is formed on the second gate insulating layer 1420. The second gate conductive layer can be formed at the same layer as that of the gate electrode 154$t$ of the aforementioned test transistor Tt.

The second gate conductive layer includes a gate line 1510, a previous gate line 1520, a light emission control line 1530, and a driving gate electrode 1540.

The gate line 1510 transmits a gate signal GW and can substantially extend in a horizontal direction. At least two portions of the gate line 1510 can cross the semiconductor pattern 1200. The gate line 1510 includes a switching gate electrode 1512 and a compensation gate electrode (not shown) that overlap the semiconductor pattern 1200. The switching gate electrode 1512 overlaps the channel region 1242 of the switching transistor T2. The channel region 1242 of the switching transistor T2 can be substantially covered by the switching gate electrode 1512. The compensation gate electrode overlaps the channel region of compensation transistor T3.

As shown in FIG. 7, when the compensation transistor T3 includes two or more channel regions that are separated from each other, the gate line 1510 can further include an additional compensation gate electrode that upwardly or downwardly extends.

The previous gate line 1520 transmits a gate signal GI and can substantially extend in the horizontal direction. The previous gate line 1520 includes an initialization gate electrode (not shown) and a bypass gate electrode 1527 that overlap the semiconductor pattern 1200.

The initialization gate electrode overlaps the channel region of the initialization transistor T4. As shown in FIG. 7, when the initialization transistor T4 includes two or more channel regions that are separated from each other, the previous gate line 1520 can overlap two channel regions of the initialization transistor T4.

The bypass gate electrode 1527 overlaps the channel region 1247 of the bypass transistor T7.

The light emission control line 1530 transmits a light emission control signal EM and can substantially extend in the horizontal direction. At least two portions of the light emission control line 1530 can cross the semiconductor pattern 1200. The light emission control line 1530 includes an operation control gate electrode 1535 and a light emission control gate electrode 1536 that overlap the semiconductor pattern 1200.

The operation control gate electrode 1535 overlaps the channel region 1245 of the operation control transistor T5. The operation control gate electrode 1535 includes a portion overlapping the gate pattern 1350 thereunder.

The light emission control gate electrode 1536 overlaps the channel region 1246 of the light emission control transistor T6.

The driving gate electrode 1540 overlaps the channel region 1241 of the driving transistor T1. The driving gate electrode 1540 can be an island that is confined to each pixel PX.

The channel region 1241 of the driving transistor T1 can be curved, and can have an oblique shape or a zigzag shape.

The driving gate electrode 1540 includes a portion that overlaps the gate pattern 1310 thereunder.

The driving gate electrode 1540, the driving source electrode 1231, and the driving drain electrode 1251 are included in the driving transistor T1 along with the channel region 1241. The switching gate electrode 1512, the switching source electrode 1232, and the switching drain electrode 1252 are included in the switching transistor T2 along with the channel region 1242. The compensation gate electrode, the compensation source electrode, and the compensation drain electrode are included in the compensation transistor T3 along with a channel region. The initialization gate electrode, the initialization source electrode, and the initialization drain electrode are included in the initialization transistor T4 along with a channel region. The operation control gate electrode 1535, the operation control source electrode 1235, and the operation control drain electrode 1255 form the operation control transistor T5 along with the channel region 1245. The light emission control gate electrode 1536, the light emission control source electrode 1236, and the light emission control drain electrode 1256 are included in the light emission control transistor T6 along with the channel region 1246. The bypass gate electrode 1527, the bypass source electrode 1237, and the bypass drain electrode 1257 are included in the bypass transistor T7 along with the channel region 1247.

An interlayer insulating layer 1600 is formed on the second gate conductive layer.

In the pixel region, the interlayer insulating layer 1600 includes a contact hole 1630 that exposes the driving gate electrode 1540. The interlayer insulating layer 1600 and the second gate insulating layer 1420 include a contact hole 1640 that exposes the gate pattern 1310. The interlayer insulating layer 1600, the first gate insulating layer 1410, and the second gate insulating layer 1420 include a contact hole 1610 that exposes the light emission control drain electrode 1256 of the light emission control transistor T6, a contact hole 1620 that exposes the bypass drain electrode 1257 of the bypass transistor T7, a contact hole 1650 that exposes the switching source electrode 1232 of the switching transistor T2, a contact hole 1660 that exposes the initialization drain electrode of the initialization transistor T4, and a contact hole 1670 that exposes the operation control source electrode 1235 of the operation control transistor T5.

A data conductive layer is formed on the interlayer insulating layer 1600. The data conductive layer includes a data line 1710, a driving voltage line 1720, a first connecting member 1730, a second connecting member 1740, and a third connecting member 1750.

The data line 1710 transmits a data signal DATA, and can substantially extend in a vertical direction to cross the gate line 1510, the previous gate line 1520, and the light emission control line 1530. The data line 1710 is connected to the switching source electrode 1232 of the switching transistor T2 through the contact hole 1650 to transmit the data signal DATA.

The driving voltage line 1720 transmits a driving voltage ELVDD, and can substantially extend in the vertical direction to cross the gate line 1510, the previous gate line 1520, and the light emission control line 1530. The driving voltage line 1720 is connected to the gate pattern 1310 through the contact hole 1640 to transmit the driving voltage ELVDD. Further, the driving voltage line 1720 is connected to the operation control source electrode 1235 of the operation control transistor T5 through the contact hole 1670 to transmit the driving voltage ELVDD.

The first connecting member 1730 is physically and electrically connected to the driving gate electrode 1540 through the contact hole 1630 and to the initialization drain electrode of the initialization transistor T4 or compensation drain electrode of the compensation transistor T3 through the contact hole 1660, finally electrically connecting the driving gate electrode 1540 to the initialization drain electrode or compensation drain electrode.

The second connecting member 1740 is physically and electrically connected to the bypass drain electrode 1257 through the contact hole 1620.

The third connecting member 1750 is physically and electrically connected to the light emission control drain electrode 1256 through the contact hole 1610.

The gate pattern 1310 receiving the driving voltage ELVDD overlaps the driving gate electrode 1540 while interposing the second gate insulating layer 1420 therebetween, thereby constituting a storage capacitor Cst.

A passivation layer 1800 is positioned on the data conductive layer. In the pixel PX, the passivation layer 1800 includes a via hole 1810 that exposes the third connecting member 1750, and a via hole 1820 that exposes the second connecting member 1740.

A pixel electrode 191 and an initialization voltage line 192 are positioned on the passivation layer 1800.

The pixel electrode 191 is electrically and physically connected to the third connecting member 1750 through the via hole 1810 that is formed in the passivation layer 1800, finally being electrically connected to the light emission control drain electrode 1256 of the light emission control transistor T6.

The initialization voltage line 192 is electrically and physically connected to the second connecting member 1740 through the via hole 1820 that is formed in the passivation layer 1800, finally being electrically connected to the bypass drain electrode 1257 of the bypass transistor T7 to transmit the initialization voltage VINT to the bypass drain electrode 1257

The pixel electrode 191 and the initialization voltage line 192 can include a transparent conductive material.

A pixel definition layer 3500 can partially cover an edge of the pixel electrode 191 and at least a part of the initialization voltage line 192. The pixel definition layer 3500 can partially cover an edge of the pixel electrode 191 and at least a part of the initialization voltage line 192. The pixel definition layer 3500 includes an opening 3505 that exposes the pixel electrode 191.

The pixel definition layer 3500 can cover both of the via holes 1810 and 1820.

A light emission layer 370 is positioned on the exposed pixel electrode 191 in the opening 3505 of the pixel definition layer 3500, and an opposed electrode 270 is positioned on the light emission layer 370.

The pixel electrode 191, the light emission layer 370, and the opposed electrode 270 are included in the OLED. The pixel electrode 191 serves as an anode of the OLED, and the opposed electrode 270 serves as a cathode of the OLED.

This structure of the pixel PX can be variously modified without being limited to the above description.

Next, a display device according to an exemplary embodiment will be described with reference to FIG. 11 together with the aforementioned drawings.

Figure 11:
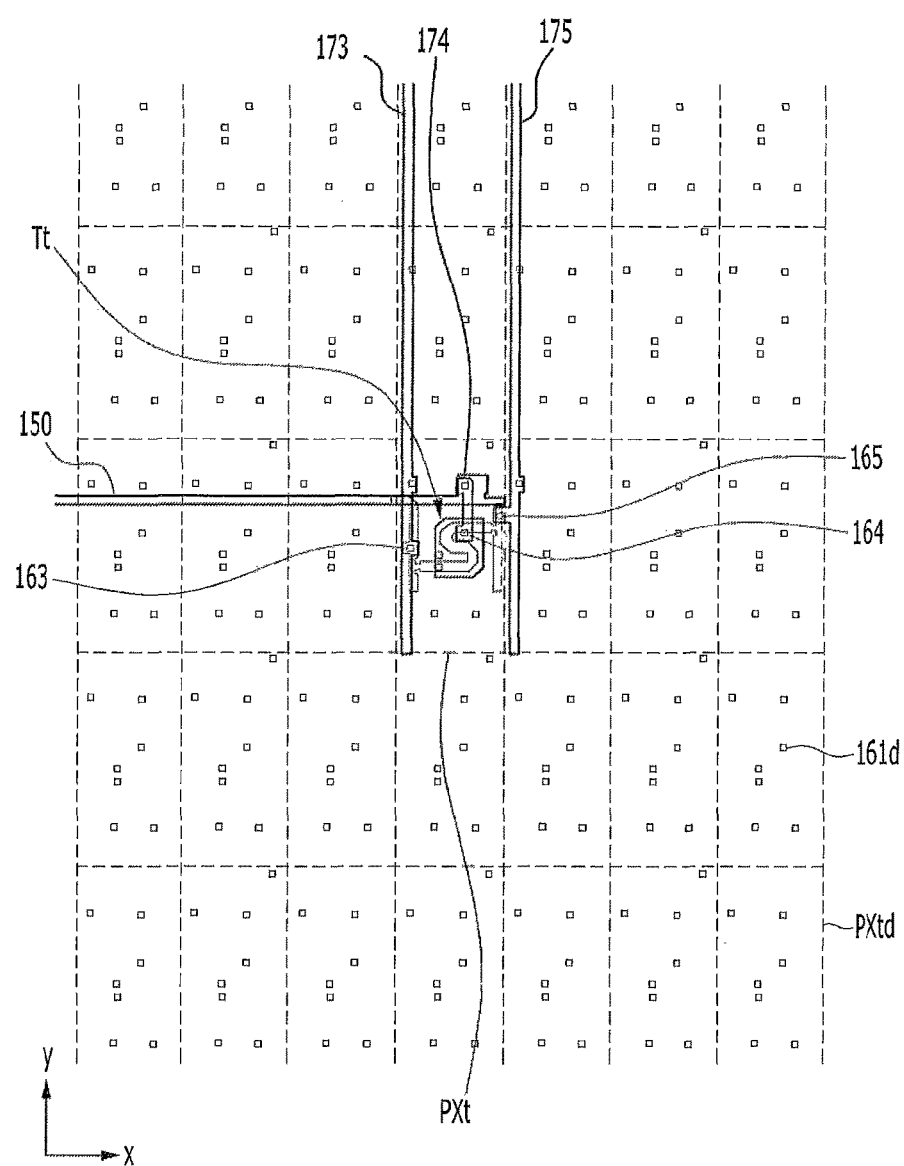
FIG. 11 is an enlarged top plan view illustrating a portion of a display device according to an exemplary embodiment.

FIG. 11 is an enlarged top plan view illustrating a portion of a display device according to an exemplary embodiment.

The display device of the present exemplary embodiment is similar to the display device described with reference to FIG. 2 to FIG. 4, but there are some differences in structures of the drain-connecting electrode 175, the gate-connecting electrode 174, and the source-connecting electrode 173 connected to the test transistor Tt included in the test unit TEG.

Referring to FIG. 11, the source-connecting electrode 173 and the drain-connecting electrode 175 are formed to extend substantially in the vertical direction (y-axis direction), and can extend parallel to each other. Although not illustrated in FIG. 11, a pad unit can be formed at each end portion of the source-connecting electrode 173 and the drain-connecting electrode 175.

The gate-connecting electrode 174 can be shortly formed, and an end portion thereof can be connected to a gate connecting wire 150 that is exposed through an additional contact hole (not illustrated) formed in the interlayer insulating layer 1600. The gate connecting wire 150 can be formed on the same layer as that of the gate electrode 154*t*, but the present exemplary embodiment is not limited thereto. The gate connecting wire 150 can be formed to extend substantially in the horizontal direction (x-axis direction), and can cross the source-connecting electrode 173 with the interlayer insulating layer 1600 therebetween. A pad unit can be formed at an end portion of the gate connecting wire 150.

According to the exemplary embodiment, the test transistor Tt can be formed in one test pixel area PXt, and the size of the test pixel area PXt can be substantially similar to the size of the pixel PX positioned in the display area DA. The dummy pixel areas PXtd can be arranged in a substantially matrix around the test pixel area PXt. Similarly, the size of each of the dummy pixel areas PXtd can be substantially similar to that of the pixel PX positioned in the display area DA.

In the test pixel area PXt, the interlayer insulating layer 1600 and/or the first gate insulating layer 1410 and the second gate insulating layer 1420 can further include the dummy contact holes 161d in addition to the contact holes 163, 164, and 165 overlapping the test transistor Tt. The numbers and/or disposition of the contact holes 163, 164, and 165 and the dummy contact holes 161d can be similar or identical to those of the contact holes included in the interlayer insulating layer 1600 and/or the first gate insulating layer 1410 and the second gate insulating layer 1420 formed in the pixel PX formed in the display area DA.

In the dummy pixel area PXtd, the interlayer insulating layer 1600 and/or the first gate insulating layer 1410 and the second gate insulating layer 1420 can include dummy contact holes 161d of which the number and/or disposition are similar or identical to those of the contact holes 163, 164, and 165 and the dummy contact holes 161d formed in the test pixel area PXt. FIG. 11 illustrates an example in which the number and/or disposition of the interlayer insulating layer 1600 and/or the first gate insulating layer 1410 and the second gate insulating layer 1420 are similar to those of the contact holes 163, 164, and 165 and the dummy contact holes 161d formed in the test pixel area PXt.

Except for the dummy contact holes 161d, no pattern can be formed in the dummy pixel area PXtd.

When the pixel PX, the test pixel area PXt, and the dummy pixel area PXtd have a shape that is longer in the vertical direction than in the horizontal direction, the number of the dummy pixel areas PXtd positioned on a right or left side of the test pixel area PXt is selected to be one to three. Further, the number of the dummy pixel areas PXtd positioned on a right or left side of the test pixel area PXt is selected to be one to three. However, the present exemplary embodiment is not limited thereto.

As such, according to the exemplary embodiment, dummy contact holes 161d of which the number and/or disposition that are similar or identical to those of the contact holes formed in the pixels PX are formed around the test pixel area PXt in which the test transistor Tt is formed. Accordingly, a surrounding condition that is substantially identical to the case in which a plurality of contact holes corresponding to other pixels PX are formed around the TFT included in the pixel DA of the display area DA is provided to the test transistor Tt. Therefore, in the contact forming process, a change in the characteristic of the TFT included in the pixel PX is substantially the same as that of the characteristic of the test transistor Tt formed in the test unit TEG, and a measured characteristic of the test transistor Tt is substantially the same as the characteristic of the TFT included in the pixel PX.

Next, a display device according to an exemplary embodiment will be described with reference to FIG. 12.

Figure 12:
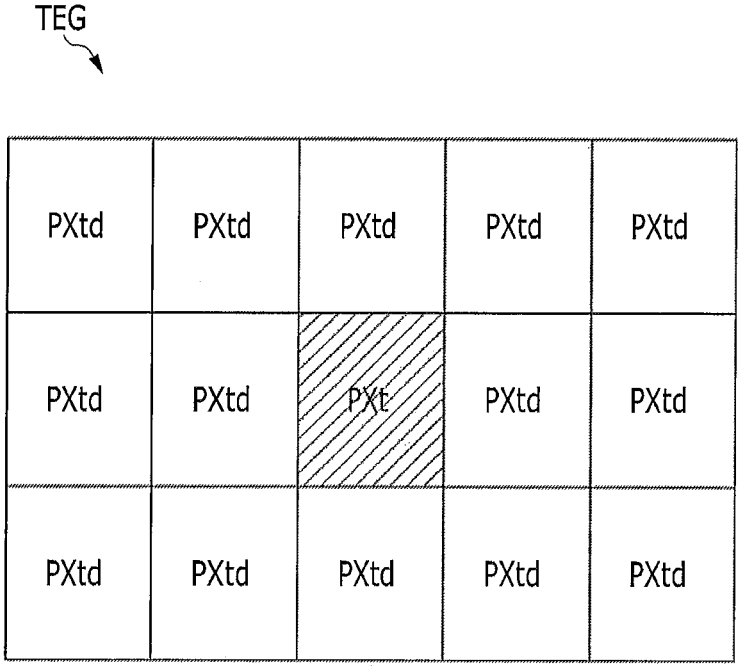
FIG. 12 is a layout view illustrating a portion of a display device according to an exemplary embodiment.

FIG. 12 is a layout view illustrating a portion of a display device according to an exemplary embodiment.

Referring to FIG. 12, the display device of the present exemplary embodiment is similar to the display device described above, but there are some differences in that the test unit TEG includes a test pixel area PXt and a plurality of dummy pixel areas PXtd positioned therearound. The test pixel area PXt and the dummy pixel areas PXtd can be arranged substantially in a matrix form. The test pixel area PXt and the dummy pixel areas PXtd can each have substantially the same structure as that of the pixel PX of the display area DA. That is, the test pixel area PXt and the dummy pixel areas PXtd can each have the same pixel structure as described above with reference to FIG. 7 to FIG. 10, for example. For example, the test pixel area PXt and the dummy pixel areas PXtd each includes a TFT having substantially the same structure as that of the TFT included in the pixel PX of the display area DA.

As such, according at least one of the disclosed embodiments, the test unit TEG includes the test pixel area PXt having the same structure as that of the actual pixel PX, and a dummy pixel area PXtd that can have the same structure as that of the actual pixel PX is positioned therearound. The contact holes included in the first gate insulating layer 1410 and the second gate insulating layer 1420 and/or the interlayer insulating layer 1600 positioned in the dummy pixel area PXtd play a similar role to the dummy contact holes 161d according to the aforementioned exemplary embodiment.

Accordingly, it is possible to indirectly inspect the characteristic of the TFT included in the pixel PX positioned in the display area DA by determining any one TFT positioned in the test pixel area PXt as the test transistor Tt and measuring the characteristic of the TFT. As a result, although the characteristic of the TFT formed in the pixel PX is not directly inspected, it is possible to correctly determine a state of the TFT formed in the pixel PX by inspecting the characteristic of the test transistor Tt of the test unit TEG.

While the inventive technology has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. A display device, comprising:
a plurality of pixels in a display area, the plurality of pixels comprising a first pixel including a first thin film transistor (TFT) and a second TFT electrically connected to the first TFT;
a test unit in a peripheral area outside the display area, the test unit comprising a test pixel including a test transistor configured to measure a characteristic of the first TFT of the first pixel; and
a first insulating layer over the test transistor and the first TFT;
wherein a plurality of first dummy contact holes are formed in the first insulating layer at the test pixel,
wherein a plurality of first contact holes are formed in the first insulating layer at the first pixel, the plurality of first contact holes including a gate contact hole exposing a driving gate electrode of the first TFT and a source or drain contact hole exposing a source region or a drain region of the second TFT, and
wherein a total number of the plurality of first dummy contact holes at the test pixel is the same as a total number of the plurality of first contact holes at the first pixel.

2. The display device of claim 1, wherein the plurality of first dummy contact holes are formed in a plurality of dummy pixel areas positioned around the test pixel in which the test transistor is formed,
wherein at least one of the dummy pixel areas is positioned on at least one side of the test pixel, and
wherein a pixel area includes one of the dummy pixel areas or the test pixel.

3. The display device of claim 2, wherein each of the dummy pixel areas has a size that is substantially the same as a size of the first pixel positioned in the display area.

4. The display device of claim 2, wherein the first insulating layer further has a plurality of second contact holes formed in a second portion of the first insulating layer located in the test pixel, and
wherein at least one of a number and a position of the second contact holes are the same as at least one of the number and the position of the first contact holes positioned in the first pixel.

5. The display device of claim 4, wherein the second contact holes include a third contact hole overlapping the test transistor and a fourth contact hole that does not overlap the test transistor, in a depth dimension of the display device.

6. The display device of claim 2, wherein at least one of the dummy pixel areas has the same structure as the first pixel positioned in the display area.

7. The display device of claim 6, wherein the test pixel is surrounded by the dummy pixel areas, and
wherein the test pixel has the same structure as the first pixel positioned in the display area.

8. The display device of claim 6, wherein each of the dummy pixel areas has a dummy TFT having the same structure as the first TFT included in the first pixel.

9. The display device of claim 6, wherein the first insulating layer further has a plurality of second contact holes formed in a second portion of the first insulating layer located in the test pixel, and
wherein at least one of a number and a position of the second contact holes is the same as that at least one of the number and the position of the first contact holes.

10. The display device of claim 9, wherein the test transistor has the same structure as the first TFT included in the first pixel.

11. A display device, comprising:
a plurality of pixels in a display area, the plurality of pixels comprising a first pixel including a first thin film transistor (TFT), a second TFT electrically connected to the first TFT, and a plurality of first contact holes including a gate contact hole exposing a driving gate electrode of the first TFT and a source or drain contact hole exposing a source region or a drain region of the second TFT;
a test unit in a peripheral area outside the display area, the test unit comprising a test pixel and a plurality of dummy pixels surrounding the test pixel, the test pixel comprising a test transistor and a plurality of first dummy contact holes, and each of the plurality of dummy pixels comprising a plurality of second dummy contact holes; and
a first insulating layer over the first TFT and the test transistor;
wherein the first TFT at the first pixel and the test transistor at the test pixel have substantially the same structure as each other, and
wherein a total number of the plurality of first contact holes and a total number of the plurality of first dummy contact holes at the test pixel are the same as each other.

12. The display device of claim 11, wherein each of the plurality of dummy pixels has a size that is substantially the same as a size of the first pixel positioned in the display area.

13. The display device of claim 11, further comprising at least one conductive line formed in one of the plurality of first contact holes and formed over the first insulating layer,
wherein the first dummy contact holes and the second dummy contact holes do not have a conductive line formed therein.

14. The display device of claim 11, wherein relative positions of the first contact holes in the first pixel and relative positions of the first dummy contact holes and the second dummy contact holes in one of the dummy pixels are substantially the same as each other.

15. A display device, comprising:
a plurality of pixels in a display area, the plurality of pixels comprising a first pixel including a first thin film transistor (TFT) and a second TFT electrically connected to the first TFT;
a test unit in a peripheral area outside the display area, wherein the test unit comprising a test pixel including a test transistor configured to measure a characteristic of the first TFT of in the first pixel;
a first insulating layer over the test transistor and the first TFT;
wherein a plurality of first dummy contact holes are formed in the first insulating layer at the test pixel;
wherein the plurality of first dummy contact holes are formed in a plurality of dummy pixel areas positioned around the test pixel in which the test transistor is formed;
wherein a plurality of first contact holes are formed in the first insulating layer at the first pixel, the plurality of first contact holes including a gate contact hole exposing a driving gate electrode of the first TFT and a source or drain contact hole exposing a source region or a drain region of the second TFT; and
wherein a total number of the plurality of first dummy contact holes at the dummy pixel areas is the same as a total number of the plurality of first contact holes at the first pixel.

16. The display device of claim 15, wherein
the first insulating layer has a plurality of second contact holes formed in a second portion of the first insulating layer located in the test pixel, and
at least one of a number and a position of the second contact holes are the same as at least one of the number and the position of the first contact holes positioned in the first pixel.

17. The display device of claim 1, further comprising:
a substrate positioned below the first insulating layer; and
at least one second insulating layer formed between the first insulating layer and the substrate,
wherein at least one of the first dummy contact holes exposes at least one of the substrate or the at least one second insulating layer.

18. The display device of claim 11, further comprising:
a substrate positioned below the first insulating layer; and
at least one second insulating layer formed between the first insulating layer and the substrate,
wherein at least one of the first dummy contact holes or the second dummy contact holes exposes at least one of the substrate and/or the at least one second insulating layer.

* * * * *